US006911660B2

(12) United States Patent
Larsen

(10) Patent No.: US 6,911,660 B2
(45) Date of Patent: Jun. 28, 2005

(54) METHOD OF MEASURING ION BEAM ANGLES

(75) Inventor: Grant Kenji Larsen, Gloucester, MA (US)

(73) Assignee: Varian Semiconductor Equipment Associates, Inc., Gloucester, MA (US)

(*) Notice: Subject to any disclaimer, the term of this patent is extended or adjusted under 35 U.S.C. 154(b) by 0 days.

(21) Appl. No.: 10/263,132

(22) Filed: Oct. 2, 2002

(65) Prior Publication Data

US 2004/0065849 A1 Apr. 8, 2004

(51) Int. Cl.$^7$ .............................. G21K 5/10; H01J 37/08
(52) U.S. Cl. .................. 250/492.21; 250/397; 250/398
(58) Field of Search ........................... 250/492.21, 397, 250/398

(56) References Cited

U.S. PATENT DOCUMENTS

| | | | |
|---|---|---|---|
| 5,180,918 A | 1/1993 | Isobe | |
| 5,696,382 A | 12/1997 | Kwon | |
| 5,898,179 A | 4/1999 | Smick et al. | |
| 5,909,622 A | 6/1999 | Kadosh et al. | |
| 6,255,662 B1 | 7/2001 | Rubin et al. | |
| 6,555,832 B1 * | 4/2003 | Ryding et al. | 250/492.21 |
| 2002/0121889 A1 | 9/2002 | Larsen et al. | |

OTHER PUBLICATIONS

Simonton, Robert and Tasch, Al, "Channeling Effects in Ion Implantation into Silicon", Ion Implantation Science and Technology, 1996, pp. 293–390, Ion Implantation Technology Co., Yorktown, NY.

Elzer, R. Daniel et al., Paper entitled "Two Methods for Improved Accuracy Calibration and Control of Ion Implanter Incidence Angle", 9 pages.

Elzer R.D. et al., "Two Methods for Improved Accuracy Calibration and Control of Ion Implanter Incidence Angle", Advanced Semiconductor Manufacturing Conference and Workshop, 1999, IEEE/SEMI, Boston, MA, Sep. 8–10, 1999, pp. 343–347.

Klein K.M. et al., "Analysis of the Tilt and Rotation Angle Dependence of Boron Distributions Implanted into <100> Silicon", Journal of the Electrochemical Society, vol. 138, No. 7, Jul. 1, 1991, pp. 2102–2107.

* cited by examiner

Primary Examiner—John R. Lee
Assistant Examiner—Paul M. Gurzo

(57) ABSTRACT

A method of determining beam twist and/or calibrating tilt angles of an ion beam of an ion beam implanter relative to a first channel of a crystalline target. The method can be used to calibrate the machine to an accuracy which is comparable to the precision of variance of such angle. The method includes the steps of a) providing reference data defining a known relationship between the beam tilt and twist angles and beam channeling in at least one preselected second channel of the crystalline target, at least some of the data providing first and second reference tilt angles at which channeling occurs for a given twist angle, the first and second tilt angles being different, b) without varying the twist angle, measuring channeling severity around a range of estimated tilt angles surrounding each of said first and second reference tilt angles and determining from the measurements a point of maximum channeling severity within each range; and c) comparing the determined points to the reference data to determine the twist angle and/or calibrate the tilt angle.

23 Claims, 5 Drawing Sheets

METHOD OF MEASURING ION BEAM ANGLES

FIELD OF THE INVENTION

The invention pertains to a method of measuring the incidence angle of an ion beam on a semiconductor wafer in an ion implanter, and the use of this method to precisely calibrate the incidence angle. In particular both tilt and twist angles are determined by the inventive method.

BACKGROUND OF THE INVENTION

In the manufacture of semiconductor devices using ion implantation, it is desirable to control the beam incidence angle, because the implantation depth is a function of the beam incidence angle as a result of the well-known channeling effect. Further, it is sometimes desirable to provide beam incidence angles other than perpendicular to the substrate plane for reasons related to the geometry of the device being manufactured. A description of ion implantation techniques utilizing tilted implantation steps can be found in U.S. Pat. No. 5,696,382 issued Dec. 9, 1997 to Kwang, and U.S. Pat. No. 5,909,622 issued Jun. 1, 1999 to Kadosh et al. As device geometries are reduced, semiconductor manufacturers increasingly require improved accuracy in measuring and controlling beam incidence angle in ion implanters. Further, semiconductor device manufacturers typically require the use of parallel scan techniques, wherein the ion beam has a constant angle of incidence on the semiconductor wafer.

Prior art ion beam incidence angle measurement involves actual angle measurement of the wafer chuck or supporting hardware. In most cases, measurement is not made in real time but is done only at maintenance intervals. Angle measurement usually employs mechanical devices, such as squares, levels, and plumb bobs. Laser beams have also been used to measure alignment. In this approach, measurements are not from semiconductor wafer to ion beam, but rather from supporting hardware to supporting hardware. There is no guarantee that the ion beam, an energetic entity sensitive to magnetic and electric fields, bears any fixed angular relationship to any mechanical hardware. Consequently angular measurements are limited to accuracies of approximately ±1 degree.

U.S. Pat. No. 5,180,918, issued Jan. 19, 1993 to Isobe, describes a method and apparatus for measuring ion beam collimation, shaping the ion beam and controlling scanning thereof. The method utilizes a time-dependent change in the scanning position of the ion beam at both an upstream and a downstream location at mutually corresponding times.

A real time beam angle incidence monitor is described in copending application of G. K. Larsen et. al, entitled "In Situ Ion Beam Incidence Angle and Beam Divergence Monitor", U.S. patent application Ser. No. 10/050,636, filed Jan. 16, 2002, the entirety of which is incorporated herein by reference. The measurement device uses an aperture and variable resistor to measure implant angle. While this method provides a real time method of angular measurement of wafer chuck directly to the ion beam (as opposed to the waveguide or other hardware), its use will be limited to regimes dictated by its accuracy.

SUMMARY OF THE INVENTION

The invention provides a method of determining beam twist and/or calibrating tilt angles of an ion beam of an ion beam implanter relative to a first channel in a crystalline target. The inventive method can be used to calibrate the machine to an accuracy which is comparable to the precision of variance of such angle. In one aspect the inventive method comprises the steps of: a) providing reference data defining a known relationship between the beam tilt and twist angles and beam channeling in at least one preselected second channel of said crystalline target, at least some of the data providing first and second reference tilt angles at which channeling occurs for a given twist angle, the first and second tilt angles being different, b) without varying the twist angle, measuring channeling severity around a range of estimated tilt angles surrounding each of the first and second reference tilt angles and determining from said measurements a point of maximum channeling severity within each said range; and c) comparing the determined points to the reference data to determine the twist angle and/or calibrate the tilt angle.

In step a) above, the known relationship utilized in the inventive method may be a characteristic meter for the twist angle, the meter corresponding to a predetermined difference angle between the first and second reference tilt angles for each twist angle. In step c) above, the angular difference between the points of maximum channeling severity may be determined and compared to said characteristic meter to ascertain said twist angle.

According to another aspect of the invention, a method is provided for measuring an ion beam incidence angle relative to a target. The method comprises the steps of selecting, from reference data representative of channeling as a function of incidence angle of an ion beam relative to a target, first and second incidence angles at which channeling is expected to be measurable, the first and second incidence angles each having first and second angular components, orienting a target at the second component of the first incidence angle relative to an ion beam and acquiring channeling data as the first angular component of the first incidence angle is varied over a range of angles, orienting the target at the second component of the second incidence angle relative to the ion beam and acquiring channeling data as the first angular component of the second incidence angle is varied over a range of angles, and determining from the acquired channeling data and the reference data an actual second angular component of the target relative to the ion beam.

According to a further aspect of the invention, a method is provided for measuring an angle of a target relative to an ion beam. The method comprises selecting, from reference data representative of channeling as a function of tilt angle and twist angle of a target relative to an ion beam, first and second tilt angles at which channeling is expected to be relatively severe for a selected twist angle, orienting a target at the selected twist angle relative to an ion beam and acquiring channeling data at the selected twist angle in a range of tilt angles around the first tilt angle, orienting the target at the selected twist angle relative to the ion beam and acquiring channeling data at the selected twist angle in a range of tilt angles around the second tilt angle and determining, from the acquired channeling data and the reference data, an actual twist angle of the target relative to the ion beam.

According to a further aspect of the invention, a method is provided for measuring an angle of a target relative to an ion beam. The method comprises selecting, from reference data representative of channeling as a function of tilt angle and twist angle of a target relative to an ion beam, first and second twist angles at which channeling is expected to be relatively severe for a selected tilt angle, orienting a target at the selected tilt angle relative to the ion beam and acquiring channeling data at the selected tilt angle in a range of twist angles around the first twist angle, orienting the target at the selected tilt angle relative to the ion beam and acquiring channeling data at the selected tilt angle in a range of twist angles around the second tilt angle, and determining, from the acquired channeling data and the reference data an actual tilt angle of the target relative to the ion beam.

Further aspects of the invention are described in the detailed description which follows.

DETAILED DESCRIPTION

Figure 1:
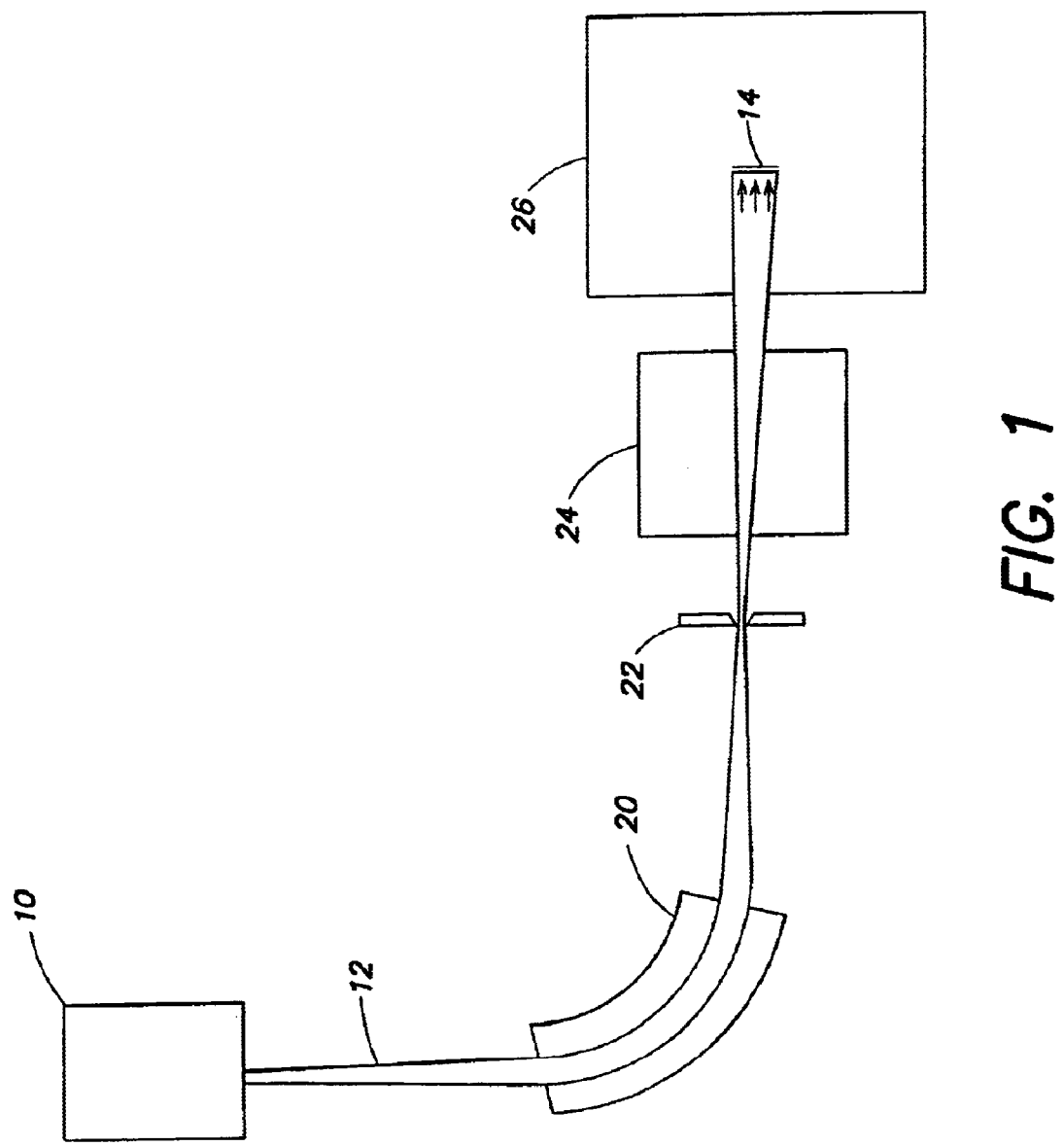
FIG. 1 is a simplified schematic block diagram of an ion implanter.

A schematic block diagram of a typical ion implanter device is shown in FIG. 1. An ion source 10 directs an ion beam 12 along a beam path toward a target 14, typically a semiconductor wafer. The ion beam 12 is deflected and focused by a mass analyzing magnet 20. The ion beam is focused in the plane of a mass resolving slit assembly 22. A variety of slit assembly configurations are known, including the rotating cylinder configuration of U.S. Pat. No. 5,629,528 and the prior slit assembly configurations described in the background thereof The ion beam 12 is accelerated to a desired energy by an accelerator 24 and impinges on the target 14 located within a target chamber 26. The entire region between the ion source 10 and the target 14 is evacuated during ion implantation.

The ion beam 12 may be distributed over the surface of target 14 by mechanically scanning target 14 with respect to the beam, by scanning the ion beam with respect to the target or by a combination of beam scanning and target scanning. Single wafer ion implanters are currently preferred by semiconductor manufacturers. In one architecture, the ion beam is scanned in one direction, e.g., horizontally and the wafer is mechanically scanned in an orthogonal direction. In another architecture, the ion beam is fixed and has the shape of a ribbon that is at least as wide as the wafer. The wafer is mechanically scanned perpendicular to the width dimension of the ribbon ion beam. In batch implanters, multiple wafers are mounted on a rotating disk during ion implantation. The target chamber 26 may include a system for automatically loading semiconductor wafers into one or more target positions for implantation and for removing the wafers from the target chamber after ion implantation.

Figure 2:
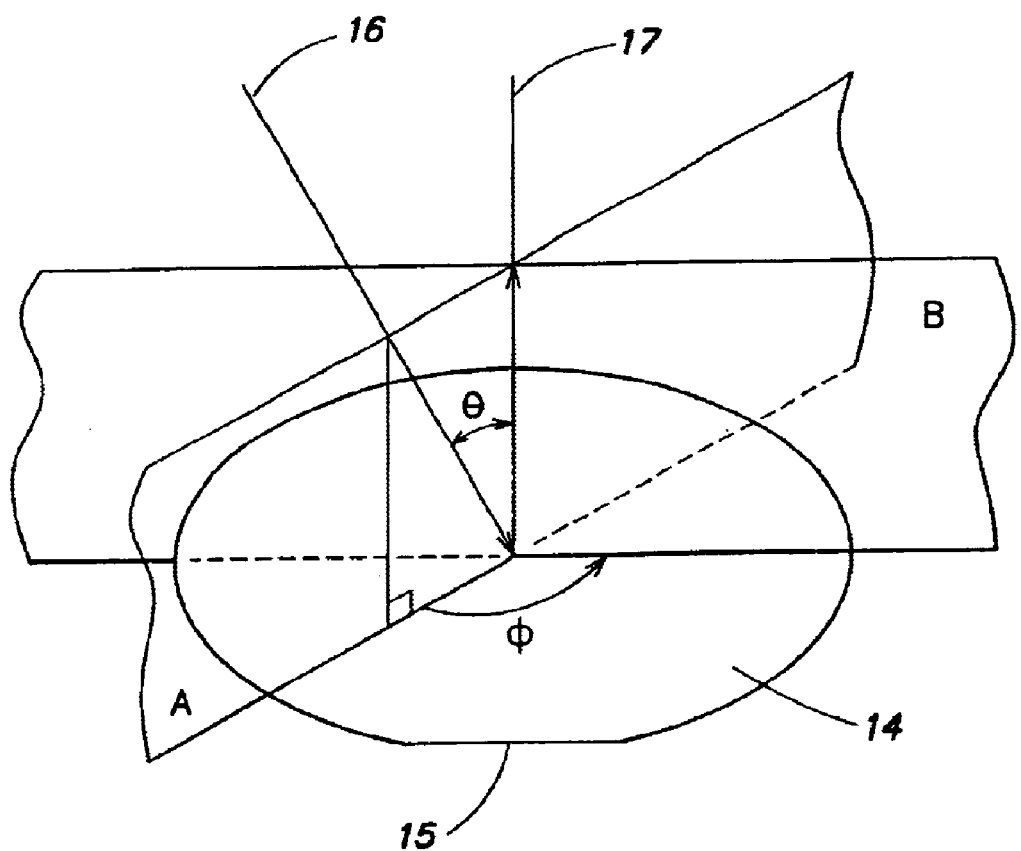
FIG. 2 is a schematic perspective view of a disk substrate being impacted by an ion beam at a tilt angle and a twist angle.

According to an aspect of the invention, an apparatus and method for measuring the incidence angle of ion beam 12 with respect to the target 14 are provided. Referring to FIG. 2, target wafer 14 having a major flat 15 is shown. An incident ion beam vector 16 has a path which can be defined relative to the wafer surface by a tilt angle θ and a twist angle φ. The tilt angle θ is defined as the angle between the incident ion beam vector 16 and a vector 17, extending normal to the wafer surface from the intersection of the ion beam vector 16 with the wafer surface. The twist angle φ is defined as the angle between planes A and B. Plane A is the plane through the incident ion beam vector 16 and the wafer normal vector 17. Plane B is a plane parallel to the major wafer flat, and perpendicular to the wafer surface. The twist angle φ is measured from plane A to plane B in a counter-clockwise direction. Thus, the tilt angle and the twist angle are angular components of the incidence angle of ion beam 12.

Embodiments of the invention use the well-known and well-defined implant responses to the phenomenon known as channeling in semiconductor crystals. Channeling can only occur within what is known as the "critical angle". This angle changes depending on type of implant, but is typically small for high energy implants. Therefore the severity of channeling can be a good indicator of angular alignment. Channeling severity may be measured in a number of different ways, including SIMS (secondary ion mass spectrometry) testing, Thermawave testing (a known technique for measuring lattice damage with a laser sensor), Prometrix four-point probe testing, sheet resistance testing, and other methods, including readbacks from real time sensors. The channeling severity effect has been used to indicate channeling in silicon along the <001> axis. This prior art method involves plotting a particular response indicating channeling severity at and immediately around the zero degree tilt angle (the angle at which the axis normal to the wafer surface intersects the axis determined by ion beam direction). At this angle, the <001> axis is coincident with the ion beam direction. Small angular deviations from the ion beam axis result in reduced channeling. If the maximum channeling is found to occur at a tilt angle setting that deviates from zero degrees, the setting is assumed to be incorrect. At that point, the machine is mechanically re-aligned by the amount of the deviation to "center" the mechanism (wafer chuck) on zero degrees tilt angle. This method is not sensitive to twist angle φ. This method allows somewhat sensitive alignment with only the <001> axis, and due to insensitivity to the twist angle, cannot be used to calibrate or adjust twist angle mechanisms.

Figure 3:
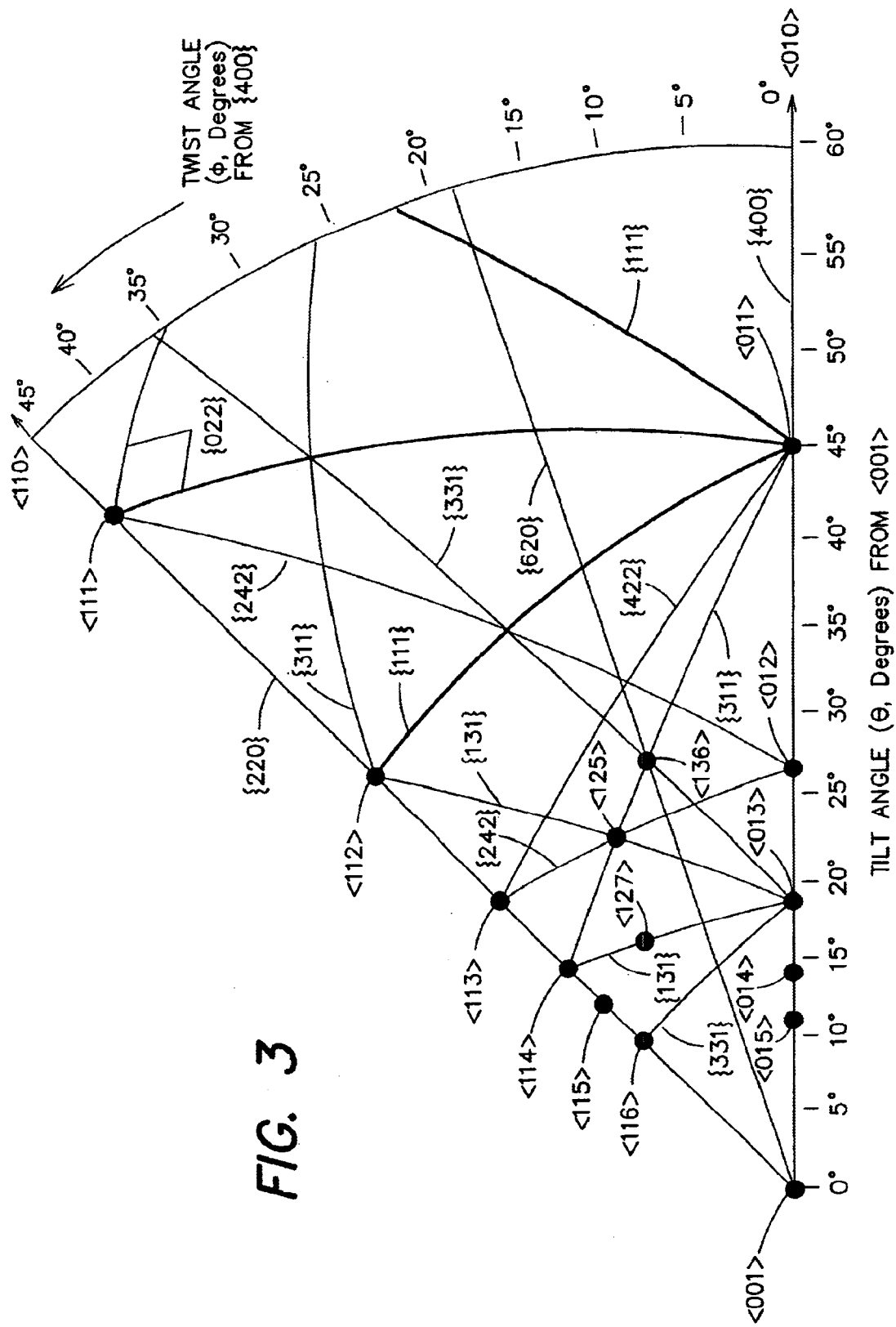
FIG. 3 is a stereographic projection graph for a silicon lattice along a <001> direction.

FIG. 3 depicts a well-known graph of Stereographic Projection for Silicon Lattice Along <001> Direction, published as FIG. 14 in "Channeling Effects in Ion Implantation into Silicon", Robert Simonton and Al Tasch, pp.293–390, in "Ion Implantation Science and Technology" ed. James F. Ziegler. (c)1996 Ion Implantation Technology Co, 663 Hanover Street, Yorktown, N.Y. 10598 U.S.A. The <001> axis is appropriate for silicon wafers milled such that the surface is perpendicular to the <001> axis, as is the SEMI specification for silicon wafers. Other diagrams may be used for other millings, or other crystal materials such as, but not limited to, germanium or gallium arsenide. The method described herein may be generalized to use any such channeling map.

In FIG. 3, poles and planes are drawn bolder in proportion to their channeling severity. The data is based on calculations from known silicon structure and can be presented with an accuracy of much better than 0.01 degree. The origin is the <001> channel around which the prior art method described above is practiced. This corresponds to the normal vector 17 in FIG. 2. Although FIG. 3 represents data for up to 45 degrees twist and for up to 60 degrees tilt, the indicated channel lines continue, successively mirroring FIG. 3 for greater twist angles until a full 360 degrees has been represented. Further, appropriate calculated projection can provide channel information at tilt angles greater than 60 degrees. From FIG. 3, it can be seen that twist angle has no effect on the ability to channel into the <001> axis at zero degrees tilt. For a wafer setting of zero degrees tilt, deviations in measurements are sensitive only to deviations in tilt angle.

Figure 4:
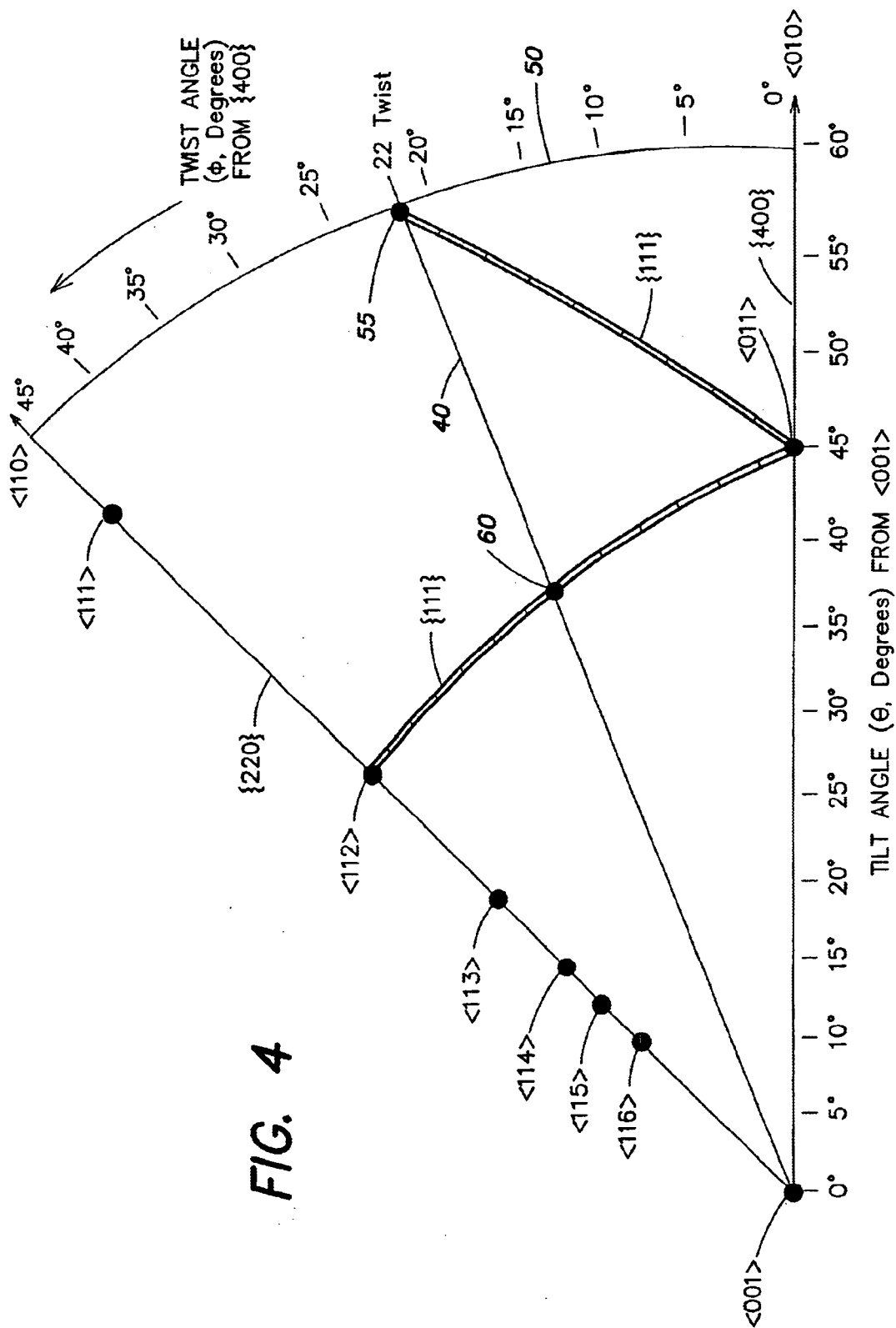
FIG. 4 is a graph as in FIG. 3, modified to show intersection of the {111} channel with a 22 degree twist line.

The methods of the invention take advantage of other channels that are available on the projection. In FIG. 4, the projection of FIG. 3 has been simplified to highlight the {111} channel. The {111} channel can be implanted using a combination of tilt angle θ and twist angle φ and is sensitive to both angles. The {111} channel is a preferred embodiment in the method as applied to silicon, due to its relative channeling severity. However any set of channels may be used, provided the response has a sufficiently high signal-to-noise ratio.

It can be seen that channeling is expected in the {111} channel at an infinite number of twist and tilt angle combinations. For example, referring to FIG. 4, in which a 22-degree twist line 40 drawn has been drawn, it can be seen that the twist line 40 intersects 60-degree tilt angle line 50 at intersection 55, indicating that {111} channeling should result if a 22-degree twist angle is used with a 60 degree tilt angle. It can be seen that the {111} channel also intersects twist line 40 at intersection 60, which corresponds to 38 degrees tilt angle. Thus, {111} channeling occurs at two different tilt angles (60 degrees and 38 degrees) for a twist angle of 22°. This condition permits the ion beam incidence angle to be measured. It will be understood that the twist angle of 22 degrees and the tilt angles of 60 degrees and 38 degrees are rounded values and that more precise values are known or can be calculated.

Figure 5:
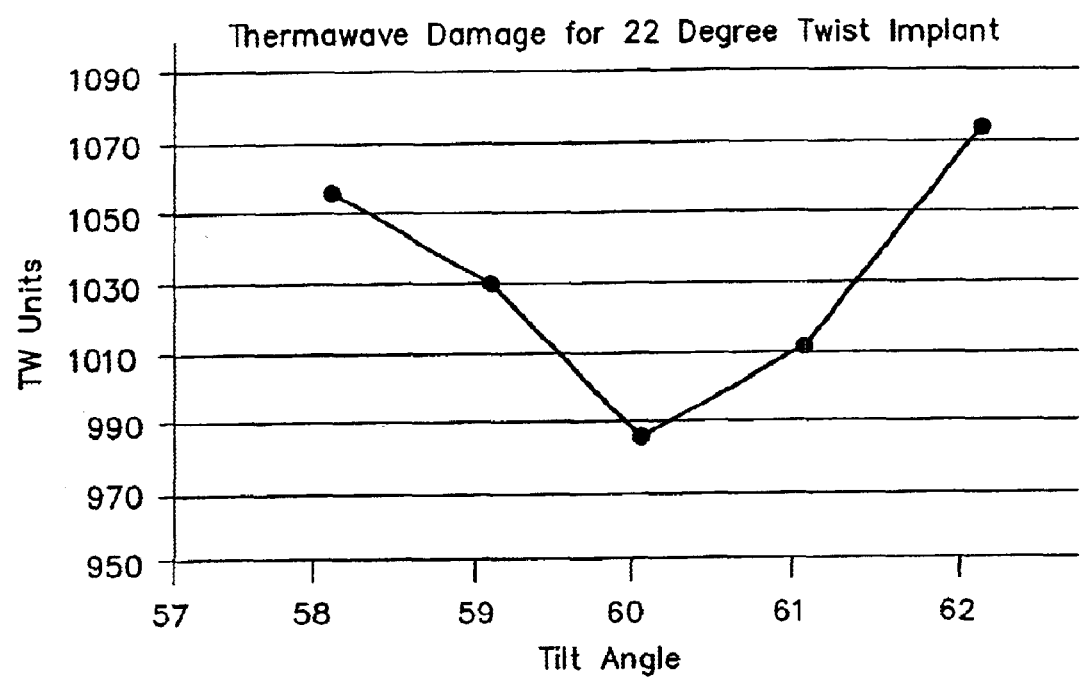
FIG. 5 is a graph of a typical response map of Thermawave damage for a 22 degree twist wafer implanted at angles in a range around 60 degrees tilt.

FIG. 5 shows a typical response map of Thermawave damage for wafers implanted at a twist angle of 22 degrees and at tilt angles in a range around 60 degrees. In FIG. 5, lower Thermawave damage levels indicate increased channeling. The response shows least damage, and consequently highest channeling, at a tilt angle of 60 degrees. A similar response is expected near intersection 60 in FIG. 4, which corresponds to a twist angle of 22 degrees and a tilt angle of 38 degrees. As noted above, the twist angle of 22 degrees and the tilt angles of 60 degrees and 38 degrees are rounded values. The exact points of intersection can be determined by stereographic projection and calculation.

In the above example and in FIGS. 3 and 4 as drawn, the accuracy of the angular measurements is only about one degree. However, accuracy of better than one-tenth of a degree, typically accuracy of one hundredth of a degree or better, can be obtained in the calculation of the channel projection, and data of comparable precision can be readily obtained for comparison with such calculated values. The data can be determined very precisely by repeated measurement. A statistical data set can be accumulated and matched accurately to the calculated response. The wafer support can be mounted on a holder whose tilt angle is controlled by known encoded motors whose rotation can be controlled to a precision of one hundredth of a degree or better. If, for example the exact intersections (with the {111} channel) for 22.00 degree twist is calculated to occur at 38.23 degrees tilt and 60.05 degrees tilt, then the difference, 21.82 degrees, can be used as a characteristic meter to calibrate twist angle, even though the tilt angle has not yet been calibrated to the same degree of accuracy.

The following steps exemplify a specific embodiment of the inventive method, in this case carried out to a precision and accuracy of one hundredth of a degree.

1) Take a statistically adequate data set in a range of a few degrees around the expected (calculated) 60.05 degrees tilt, using an approximately 22-degree twist angle, which is held constant as the tilt angle is varied. Record the uncalibrated tilt angles to the nearest hundredth of a degree, as reflected by motor encoder counts.

2) Take a statistically adequate data set in a range of a few degrees around the expected (calculated) 38.23 degrees tilt, using a 22-degree twist angle.

3) Plot the data to determine the actual channel locations, in terms of tilt angle, for example in the manner of FIG. 5. Determine the difference angle between the two channel locations as plotted.

4) If the difference angle between the two channel locations in the data sets is not equal to 21.82 degrees, then the actual twist angle deviates from the setting of 22 degrees. The amount of deviation depends on the magnitude of departure from the expected (calculated) value.

5) Since the two {111} curves are not parallel, the data set analysis produces a number for the difference angle which is unique to a particular twist angle, and which is not dependent on the accuracy of the tilt angle calibration. Referring again to FIG. 4, it can be seen that, for a twist line going through the origin, the difference angle corresponds to the distance between channel intersections 55 and 60. For a constant twist angle, a particular difference angle value occurs at only one combination of tilt angles, and the intersections define exactly the tilt angles and the twist angle achieved, with an accuracy depending only on the precision of the angular measurements. Therefore, it is possible to determine the twist angle and to directly back-calculate which exact tilt angles have been achieved by the actual mechanical mechanism, and re-calibrate the wafer orientation mechanism such that it accurately records the achieved angles. This re-calibration can be done by setting motor encoder counts, which typically have a resolution of several hundred counts per degree.

This process can be performed at two different twist angles to calibrate not only for offset, but for any scaling error in the mechanism. Since the stereographic projection repeatedly mirrors around the horizontal and 45-degree twist axes, a calibration can be performed at, for example, 22 degrees twist and −22 degrees twist. To acquire the data set at −22 degrees twist, the mechanism is commanded to rotate the wafer to the 338 degree orientation. This provides the data sets at two points (using the same calculated value) that are necessary for both offset and scaling calibrations, and the two sets are located at almost the extreme ends of the mechanism range (assuming a zero to 360 degree range) for maximum resolution. It is not a requirement to use mirror twist angles for each data set. However, this approach requires only one data set difference calculation. By way of example, twist angles of 22 degrees and −40 degrees (320 degrees) may be used. Furthermore, the calibration may be performed at twist angles other than 22 degrees. Angles closer to zero (and to 360) may increase the resolution at which the calibrations are performed, but care must be taken since, as the twist angle approaches zero, the distance between intersections decreases, and eventually becomes indistinguishable.

The above method permits the wafer orientation mechanism to be calibrated exactly such that the angular relationship between the semiconductor wafer and the ion beam is achieved, to the resolution of the motor encoders. Prior art methods use mechanical devices such as squares and lasers which bear no relationship to the ion beam, and are accurate only to levels on the order of one degree, which is the limiting tolerance for mechanical devices plus human error. The new method is limited only by encoder resolution and cost (in time or money) of data acquisition and analysis.

The method need not only be applied to motor encoders. The data analysis can be used to produce numbers which can be acted upon by strict mechanical adjustment, which involves the aforementioned human error and mechanical tolerances, but which can eventually (by trial and error) result in the desired settings.

The method need not use both intersections with the {111} channel. However, this approach is preferred because of the channeling severity. For example, at 22 degree twist, the 60-degree tilt intersection with the {111} channel, and the 16-degree tilt intersection with the {131} channel may be used. However, this combination will not provide as strong a response as both {111} channel intersections.

The method of the present invention may be used with real time data collection and analysis, or with post-process data analysis. The reference data of the selected channel(s) which is used for comparison with the measured channeling severity data may be graphic, as represented in FIGS. 4 and 5, numeric, tabular, or may be calculated in real time from known algorithms. The comparisons described above can be performed by a suitably programmed computer or directly by the operator.

The above method describes calibration of the wafer orientation mechanism. Once this is achieved, the data can be considered extremely accurate for twist angle. A similar method can be used to calibrate the tilt angle. The 60 degree tilt angle channeling response at any given twist angle is the same as the −60 degree tilt angle response. A 60 degree tilt to −60 degree tilt is considered a wide range for ion implantation, so in this example it will be used. However, another range, such as 50/−50 degrees or 75/−75 degrees, may be used. Mirror angles need not be used, such that if the mechanism does not allow a full sweep, angles such as 60/−30 degrees or 60/0 degrees may be used.

Now that at this point in the method the twist angle is well calibrated over a wide range, the tilt angle can also be calibrated over a wide range by taking data sets at two particular tilt/twist combinations where a channel intersection is expected. For 60 degrees tilt, for example, the {111} channel is expected to intersect at 22 degrees twist. At −60 degrees tilt, a similar intersection is expected at 22 and/or −22 degrees twist. Therefore, the responses for these two intersections can be plotted and used to set each point. Knowing that the twist angle, which has been calibrated, is accurate, the tilt angle can be determined at each point to set offset and scaling error. Setting two ends of a tilt sweep provides much more accuracy than the prior art method of setting only the center, and again, can be performed by readback to the motor encoders or by manual adjustment.

More than two points may be measured, to increase accuracy and to account for any non-linearity in the range of the mechanism motion. It may be valuable to measure the response in implant orientations that are expected or desired, such as the 0 twist/0 tilt orientation. Again, this orientation cannot be used to calibrate twist angle, but can be used as a valuable point for tilt angle.

The methods for measuring ion beam incidence angle described above involve calibrating wafer twist angle by finding a characteristic difference, or meter, between two data sets centered on expected intersections with crystal channels. The meter is a characteristic number that can describe only one twist angle in the vicinity of the twist angle of interest. Therefore, if the data sets reflect a twist angle that is different from the expected one, the hardware and or software can be adjusted until the settings coincide with the data set meter. When the twist angle is set by the method, the tilt angle can be set accurately. The methods involve using intersections with channels that are sensitive to both tilt and twist angle in order to calibrate these angles, but does not require that the twist angle be set before the tilt angle as described above.

In another approach, the methods may be employed where the tilt angle is calibrated before the twist angle. Since the {111} channel tracks across the stereographic projection from 45 degrees tilt/0 degrees twist to 60 degrees tilt/22 degrees twist and beyond, and a similar {111} channel tracks from the identical starting point to 60 degrees tilt/−22 degrees twist, a characteristic difference, or meter, may be found for tilt angle. The two lines, diverging from the 45 degrees tilt/0 degrees twist point, intersect an arc on which tilt angle is held constant. So, for a 60 degrees tilt arc, one expects to find {111} channel intersections at 22 degrees twist and −22 degrees (or 338 degrees) twist. Data sets can be acquired in the vicinity of 60 degrees tilt/22 degrees twist and in the vicinity of 60 degrees tilt/−22 degrees twist. The difference between the intersections found in the data is the characteristic difference value. If the acquired data produces a value different from the calculated value at 60 degrees tilt, then the acquired value can be used to determine the true tilt angle, since the meter is unique for values of tilt angle close to 60 degrees tilt. The adjustment of the mechanism to actual data can be made, calibrating the tilt angle at one point.

The process can be repeated for a different tilt angle to provide a second point to calibrate for both scaling and offset errors. A convenient second data set in this example is on the −60 degrees tilt arc, which has the same characteristic meter as the already calculated 60 degrees tilt arc. However, the use of mirror angles is not a requirement. When the tilt angle has been calibrated in this way, the twist angle may be set by searching with intersection with convenient channel intersections in much the same way. Two data sets across a large range may be used to establish two points to calibrate both offset and scale in the twist axis.

If the scale error is guaranteed to be negligible by motor encoder counts or other means, two data sets on the second axis are not required. Two data sets are still required on the first axis to decouple the axes, but thereafter scale error can be ignored and one data set on the second axis may be used to set offset. The one data set on the second axis may be identical to either of the data sets acquired on the first axis, thus resulting in a minimum data collection of two sets. Alternatively, if significant scale error is expected, multiple points across the range may be tested to account for non-linearities that may exist in the motion axes.

Another approach to the channeling intersection method includes choosing any three unique combinations of tilt angle and twist angle that are expected to intersect a channel with sufficient resolution, and acquiring data sets around those points. In the following example, the {111} channel is again used, but the technique can be applied to any channel with sufficient signal-to-noise ratio. Three points are chosen, which intersect the {111} channel. Data sets are acquired around the three points, defined in this example as 37 degrees tilt/30 degrees twist, 43 degrees tilt/10 degrees twist, and 60 degrees tilt/22 degrees twist. The data from these three points may differ slightly from the calculated data. The departure from the expected values at three different points is sufficient to calculate offset and scale error on both axes. For both axes, only a unique set of three tilt angle/twist angle settings can produce a triangulated shape located on channeling lines. Data from the three unique tilt angle settings can be correlated to the actual angles obtained from the calculated data, producing offset and scale for the tilt axis. The same data can be used to correlate the three unique twist angles in a similar manner. Additional points may be used for any non-linearity that may exist in the motion axes.

In the case where software is used to address motor encoders, data may be taken on wafers, processed and entered manually. For manual adjustments, the data is taken and then manually acted upon. These methods might be considered time-intensive or cumbersome, but may be justified on a cost basis when extremely accurate and highly repeatable deep-well implants result.

A real time method using sensors mounted accurately on the wafer chuck may be employed. The use of such sensors allows a channeling response to be obtained in real time, and a curve can be calculated and plotted by machine software or electronic hardware built for that purpose. The output from the data collection can be fed directly to the motor controllers, which use the motor encoder readback for positioning. In this case the method (calculation, data collection, analysis, and adjustment/calibration) is done not manually, but automatically. This may assist in reducing the cost in time and/or money of employing the disclosed method.

Once a machine is well calibrated, a sampling of a few data points is enough to keep the machine calibrated, as the data points can be curve fit to the by-then well-established response curve, without sacrificing angular accuracy.

The above description is intended to be illustrative and not exhaustive. The description will suggest many variations and alternatives to one of ordinary skill in this art. All these alternatives and variations are intended to be included within the scope of the attached claims. Those familiar with the art may recognize other equivalents to the specific embodiments described herein which equivalents are also intended to be encompassed by the claims attached hereto. Further, the particular features presented in the dependent claims below can be combined with each other in other manners within the scope of the invention such that the invention should be recognized as also specifically directed to other embodiments having any other possible combination of the features of the dependent claims.

What is claimed is:

1. A method of determining beam twist and/or calibrating tilt angles of an ion beam of an ion beam implanter, relative to a first channel of a crystalline target to calibrate an incident angle of the ion beam to the crystalline target, the method comprising:
   a) providing reference data defining a known relationship between said beam tilt and twist angles and beam channeling in at least one preselected second channel of said crystalline target, at least some of said data providing first and second reference tilt angles at which channeling occurs for a given twist angle, the first and second tilt angles being different,
   b) without varying the twist angle, measuring channeling severity around a range of estimated tilt angles surrounding each of said first and second reference tilt angles and determining from said measurements a point of maximum channeling severity within each said range; and
   c) comparing the determined points to the reference data to determine said twist angle and/or calibrate said tilt angle for achieving a desired angular relationship between the incident angle of the ion beam and the crystalline target.

2. A method as in claim 1, wherein in step a) said known relationship includes a characteristic meter for said twist angle, the meter corresponding to a predetermined difference angle between said firs and second reference tilt angles for each twist angle, and in step c) the angular difference between said points of maximum channeling severity is determined and compared to said characteristic meter to ascertain said twist angle.

3. A method as in claim 2, wherein after determining said twist angle, the corresponding first and second reference tilt angles values for said twist angle are ascertained, and the tilt angle of the ion beam is calibrated by correlating the tilt angles at said maximum channeling points to said corresponding reference tilt angles.

4. A method as in claim 1, wherein said crystalline target is silicon and said first channel thereof is the <001> channel.

5. A method as in claim 4, wherein said at least one preselected second channel of said crystalline target comprises the {111} channel.

6. A method as in claim 5, wherein in step a) both of said reference tilt angles are in the {111} channel, said first reference tilt angle is below 45 degrees, and the second of said reference tilt angles is above 45 degrees.

7. A method as in claim 1, wherein said first and second reference tilt angles occur in two different channels of said crystalline target.

8. A method as in claim 7, wherein said crystalline target is silicon, said first channel thereof is the <001> channel, and said two different channels are the {111} and the {131} channels.

9. A method as in claim 1, wherein said reference data is provided in a machine readable data format, and said comparing step c) is performed by a computing machine.

10. A method as in claim 8, wherein said machine readable data format is selected from numeric, equation, tabular and graphic data formats.

11. A method as in claim 1, wherein the tilt angle is varied within said ranges of estimated tilt angles by a rotation mechanism having an angular rotation precision of ±0.1 degree or better.

12. A method as in claim 11, wherein said rotation precision is ±0.01 degree or better.

13. An ion implanter including means for implementing a method as in claim 1.

14. A method for measuring an angle of a target relative to an ion beam to calibrate an incident angle of the ion beam to the target, comprising:
   selecting, from reference data representative of channeling as a function of tilt angle and twist angle of a target relative to an ion beam, first and second tilt angles at which channeling is expected to be relatively severe for a selected twist angle;
   orienting a target at the selected twist angle relative to an ion beam and acquiring channeling data at the selected twist angle in a range of tilt angles around the first tilt angle;
   orienting the target at the selected twist angle relative to the ion beam and acquiring channeling data at the selected twist angle in a range of tilt angles around the second tilt angle;
   determining, from the acquired channeling data and the reference data, an actual twist angle of the target relative to the ion beam for achieving a desired angular relationship between the incident angle of the ion beam and the target.

15. A method for measuring an angle of a target relative to an ion beam to calibrate an incident angle of the ion beam to the target, comprising:

selecting, from reference data representative of channeling as a function of tilt angle and twist angle of a target relative to an ion beam, first and second twist angles at which channeling is expected to be relatively severe for a selected tilt angle;

orienting a target at the selected tilt angle relative to an ion beam and acquiring channeling data at the selected tilt angle in a range of twist angles around the first twist angle;

orienting the target at the selected tilt angle relative to the ion beam and acquiring channeling data at the selected tilt angle in a range of twist angles around the second twist angle; and determining, from the acquired channeling data and the reference data, an actual tilt angle of the target relative to the ion beam for achieving a desired angular relationship between the incident angle of the ion beam and the target.

16. A method for measuring an ion beam incidence angle relative to a target to calibrate an incident angle of the ion beam to the target, comprising:

selecting, from reference data representative of channeling as a function of incidence angle of an ion beam relative to a target, first and second incidence angles at which channeling is expected to be measurable, said first and second incidence angles each having first and second angular components;

orienting a target at the second component of the first incidence angle relative to an ion beam and acquiring channeling data at the first angular component of the first incidence angle is varied over a range of angles;

orienting the target at the second component of the second incidence angle relative to the ion beam and acquiring channeling data as the first angular component of the second incidence angle is varied over a range of angles; and determining, from the acquired channeling data and the reference data an actual value of the second angular component of the target relative to the ion beam for achieving a desired angular relationship between the incident angle and the target.

17. A method as defined in claim 16, wherein the first angular component is the tilt angle and the second angular component is the twist angle.

18. A method as defined in claim 16, wherein the first angular component is the twist angle and the second angular component is the tilt angle.

19. A method as defined in claim 16, wherein the second angular components of the first and second incidence angles are equal.

20. A method as defined in claim 16, wherein the reference data represents a silicon semiconductor wafer.

21. A method as defined in claim 16, wherein the step of determining the actual value of the second angular component of the target relative to the ion beam comprises determining actual values of the first angular component at the first and second incidence angles, determining a difference between the actual values of the first angular components and comparing the difference to a difference between reference values of the first angular components to determine a deviation of the actual value of the second angular component from a reference value.

22. A method as defined in claim 16, wherein the steps of acquiring channeling data each comprise implanting targets at a series of values of the first angular component of the first and second incidence angles and measuring channeling severity in each of the implanted targets.

23. A method as defined in claim 16, further comprising adjusting a target support to reduce a difference between a reference value of the second angular component and the actual value of the second angular component.

* * * * *